(12) United States Patent
Doneker et al.

(10) Patent No.: US 8,569,631 B2
(45) Date of Patent: Oct. 29, 2013

(54) NOISE DAMPENING ENERGY EFFICIENT CIRCUIT BOARD AND METHOD FOR CONSTRUCTING AND USING SAME

(75) Inventors: Robert L. Doneker, Portland, OR (US); Kent G. R. Thompson, Portland, OR (US)

(73) Assignee: Tangitek, LLC, Portland, OR (US)

( * ) Notice: Subject to any disclaimer, the term of this patent is extended or adjusted under 35 U.S.C. 154(b) by 0 days.

(21) Appl. No.: 13/101,908

(22) Filed: May 5, 2011

(65) Prior Publication Data

US 2011/0209909 A1 Sep. 1, 2011

(51) Int. Cl.
*H05K 1/03* (2006.01)

(52) U.S. Cl.
USPC ............. 174/256; 174/260; 174/262

(58) Field of Classification Search
None
See application file for complete search history.

(56) References Cited

U.S. PATENT DOCUMENTS

| | | | |
|---|---|---|---|
| 4,327,247 A | 4/1982 | Mituhashi et al. | |
| 4,591,659 A | 5/1986 | Leibowitz | |
| 4,643,499 A | 2/1987 | Mitchell | |
| 4,812,792 A | 3/1989 | Leibowitz | |
| 4,849,765 A | 7/1989 | Marko | |
| 4,952,448 A | 8/1990 | Bullock et al. | |
| 4,963,697 A | 10/1990 | Peterson et al. | |
| 5,161,093 A | 11/1992 | Gorczyca et al. | |
| 5,311,406 A | 5/1994 | Snodgrass et al. | |
| 5,384,435 A | 1/1995 | Fuerst et al. | |
| 5,428,506 A * | 6/1995 | Brown et al. | 361/794 |
| 5,519,585 A | 5/1996 | Jones et al. | |
| 5,568,006 A | 10/1996 | Luff et al. | |
| 5,774,336 A | 6/1998 | Larson | |
| 6,160,223 A | 12/2000 | Gates | |
| 6,346,747 B1 | 2/2002 | Grill et al. | |
| 6,451,710 B1 | 9/2002 | Oka et al. | |
| 6,524,115 B1 | 2/2003 | Gates et al. | |
| 6,531,390 B2 | 3/2003 | Chooi et al. | |
| 6,544,638 B2 | 4/2003 | Fischer et al. | |
| 6,566,260 B2 | 5/2003 | Chooi et al. | |
| 6,621,373 B1 | 9/2003 | Mullen et al. | |
| 6,663,799 B2 | 12/2003 | Kokubo et al. | |
| 6,697,709 B2 | 2/2004 | Kuroki et al. | |
| 6,818,821 B2 | 11/2004 | Fujieda et al. | |
| 6,866,764 B2 | 3/2005 | Dalman et al. | |

(Continued)

FOREIGN PATENT DOCUMENTS

| | | |
|---|---|---|
| CA | 1341340 C | 2/2002 |
| JP | 11177275 A | 7/1999 |

(Continued)

*Primary Examiner* — Ishwarbhai Patel
(74) *Attorney, Agent, or Firm* — Marger Johnson & McCollom, P.C.

(57) ABSTRACT

A noise dampening energy efficient circuit board includes a carbon material layer for dampening electromagnetic interference between surface mount components and trace patterns of the circuit board. One or more ground plane layers are arranged relative to the carbon material layer to cooperatively dampen and repel noise of varying frequencies. The positioning of the carbon material layer with respect to the ground plane layer enhances the ground plane operation. Glass fiber material layers and other insulating dielectric layers are disposed at particular locations within the noise dampening energy efficient circuit board. The carbon material layer and the ground plane layer dampen electromagnetic noise, thereby permitting energy saving design considerations, increasing energy efficiencies and reducing power consumption. Mounting posts of the surface mount components include insulating sleeves to selectively insulate different layers of the circuit board from surface mount components. Methods for constructing and using the circuit board are also disclosed.

13 Claims, 8 Drawing Sheets

(56) References Cited

U.S. PATENT DOCUMENTS

| | | | |
|---|---|---|---|
| 6,914,183 B2 | 7/2005 | Inazawa et al. | |
| 6,926,751 B2 | 8/2005 | Kokubo et al. | |
| 6,937,120 B2 | 8/2005 | Fisher et al. | |
| 6,988,925 B2 | 1/2006 | Arthur et al. | |
| 7,005,573 B2 | 2/2006 | Lionetta et al. | |
| 7,014,094 B2 | 3/2006 | Alcoe | |
| 7,038,142 B2* | 5/2006 | Abe | 174/255 |
| 7,420,130 B2* | 9/2008 | Okamoto et al. | 174/262 |
| 7,479,013 B2* | 1/2009 | Takezaki et al. | 439/55 |
| 7,687,724 B2* | 3/2010 | Das et al. | 174/262 |
| 2005/0056922 A1 | 3/2005 | Vasoya et al. | |
| 2006/0108147 A1 | 5/2006 | Abe et al. | |
| 2007/0186414 A1 | 8/2007 | Abe et al. | |
| 2008/0011507 A1* | 1/2008 | Vasoya | 174/260 |
| 2008/0149901 A1 | 6/2008 | Choi et al. | |
| 2008/0282538 A1 | 11/2008 | Takezaki et al. | |
| 2009/0098391 A1* | 4/2009 | Nakagawa et al. | 428/433 |
| 2009/0104405 A1* | 4/2009 | Patten et al. | 428/138 |
| 2010/0163795 A1* | 7/2010 | Kim et al. | 252/299.6 |

FOREIGN PATENT DOCUMENTS

| | | |
|---|---|---|
| JP | 2006114606 A1 | 4/2006 |
| JP | 2006140430 A | 6/2006 |
| JP | 2006294749 A1 | 10/2006 |

\* cited by examiner

NOISE DAMPENING ENERGY EFFICIENT CIRCUIT BOARD AND METHOD FOR CONSTRUCTING AND USING SAME

TECHNICAL FIELD

This disclosure relates to circuit boards, and, more particularly, to a noise dampening energy efficient circuit board for reducing unwanted electromagnetic interference between layers and components of a circuit board, and a method for constructing and using the circuit board.

BACKGROUND

Printed circuit boards (PCBs) are widely used in a variety of industries and in virtually all but the simplest electronic devices. Computers, phones, mobile devices, antenna systems, vehicles, gaming systems, and indeed, a broad array of consumer electronics, and the like, are but a few examples of things that commonly include or otherwise rely on circuit boards.

PCBs conventionally include different conductive and non-conductive or insulating dielectric layers. The conductive layers can be etched into a pattern of tracks or signal traces. The insulating dielectric layers can separate the conductive layers, and in addition, provide a substrate for the pattern etch. Multi-layer circuit boards can have trace layers inside the PCB. Through-holes or vias can be formed to connect the different layers. Separately etched boards can be bonded together to make a multi-layer board. Surface mount components are disposed on either an upper or lower surface, or both, and connected one to another using the traces or vias between the layers.

While PCBs are commonplace today, technical challenges remain for improving signal quality and robustness of the boards. Electromagnetic noise can interfere with signals transmitted between PCB layers and/or components. Noise from external sources can also impact the PCB components, traces, and the like. Such unwanted interference, irrespective of its source, can diminish the quality and accuracy of signals, thereby introducing errors into the signals, or otherwise hindering the performance of the PCB and associated components. Efforts to boost signal performance can also lead to higher and unnecessary power consumption by the circuit components, which can cause additional amounts of noise.

Moreover, using conventional techniques, many of the technical aspects of the PCB board must be designed before layup. For instance, connections and chip types must be known or specified before layup so that the specific layout pattern, through-holes, and layer architecture of the PCB conform to the pre-specified design. Through-holes, vias, and connection types are specified before or during layup, and before lamination. Insulation for the vias is built-in to the PCB layers themselves. These approaches are inflexible in their design because subsequent changes to the via structure or layout pattern after layup is difficult or impossible. These types of problems especially manifest themselves during the development and testing phases of board design.

Accordingly, a need remains for a noise dampening energy efficient circuit board for reducing unwanted electromagnetic interference between layers and components of PCBs, and improved methods for constructing and using PCBs. In addition, a need remains for improving the power and energy efficiencies of PCBs. Embodiments of the invention address these and other limitations in the prior art.

The foregoing and other features of the invention will become more readily apparent from the following detailed description, which proceeds with reference to the accompanying drawings.

DETAILED DESCRIPTION

FIGS. 1A-1E illustrate cross sectional views of a noise dampening energy efficient (NDEE) circuit board 100 at various stages of construction, including electromagnetic absorbing carbon elements according to one example embodiment of the present invention. Reference is now made to FIGS. 1A through 1E.

The NDEE circuit board 100 includes a carbon material layer 110 for dampening electromagnetic noise 165 from interfering with the surface mount components 150 and traces 125 associated with the conductive layer 120. The carbon material layer 110 has a particular thickness 112, which can be, for example, up to one (1) millimeter in thickness. In some embodiments, the carbon material layer 110 extends contiguously between the edges 102 of the circuit board 100. The carbon material layer 110 is preferably comprised of or otherwise includes resin-impregnated carbon fiber fabric. In a preferred embodiment, the resin-impregnated carbon fiber fabric has a specific resistance no greater than 100 $\Omega/cm^2$. In some embodiments, the carbon material layer 110 includes carbon nanotube material.

The carbon material layer 110 diminishes the degrading effects of unwanted electromagnetic radiation 165 on signal quality. In other words, the carbon material layer 110 acts as a shielding agent, which absorbs at least a portion of the background noise 165 generated by surface mount components (e.g., 150), and/or external noise sources 165, from becoming introduced into signals transmitted between different layers and/or components of the circuit board 100. As a result, the electromagnetic noise relative to the circuit board, its components, and the signals transmitted among the components, is reduced. The arrangement and dampening characteristics of the carbon material layer 110 contribute to the reduction of noise, or otherwise improve the noise ratio, by approximately 3 Decibels or more for low-frequency applications, and between approximately 1 to 3 Decibels for high-frequency applications.

A conductive layer 120 is disposed on a glass fiber material layer 115, the glass fiber material layer 115 having a particular thickness 117, which can be, for example, up to one (1) millimeter in thickness. The conductive layer 120 is preferably copper (Cu), but can include any suitable conductor including gold (Au), silver (Ag), and so forth. The glass fiber material layer 115 is disposed on the carbon material layer 110.

The carbon material layer 110, having a particular thickness 112, is disposed on an insulating dielectric layer 105. The dielectric layer 105 is designed to be thicker for higher frequency signals and thinner for lower frequency signals. More specifically, the insulating dielectric layer 105 is thinner than the thickness 112 of the carbon material layer 110 and the thickness 117 of the glass fiber material layer 115. The dielectric layer 105 can be any suitable insulator or dielectric, including glass fiber material. Layers 105, 110, 115, and 120 are bonded to form the NDEE circuit board 100. The process of arranging and bonding the NDEE circuit board layers one to another is referred to herein as "layup."

During layup, epoxy can be infused into the carbon material layer 110 and/or other layers. In some embodiments, the various layers can then be vacuum-infused, laminated, and/or bonded at room temperature as further described in detail below. In some embodiments, the various layers can be laminated and bonded at temperatures higher than room temperature and/or by the application of pressure using any suitable means. This process results in a "blank" board 100, which can then be patterned, drilled, and/or stacked to accommodate any connection or chip type after layup. Moreover, through-holes or vias can be created in the board 100 after layup, and selectively insulated, which is also described in additional detail below.

After forming the "blank" NDEE circuit board 100, the conductive layer 120 can be eventually etched or otherwise formed into a pattern 125, leaving only the desired conductive traces 125. It should be understood that any suitable method for forming or etching the pattern 125 can be used, including silk screen printing, photographic or photomask methods, laser-printed resist or ablation, and/or milling, among other suitable methods.

One or more through-holes 130 and 135 can be drilled or otherwise created in the NDEE circuit board 100 after layup, and either before or after forming the pattern 125 in the conductive layer 120. The through-holes, such as 130, can extend fully through the various layers 120, 115, 110, and/or 105 of the NDEE circuit board 100. Alternatively, the through-holes, such as 135, can extend partially through a subset of the various layers. One or more surface mount components 150 can be disposed on the conductive pattern 125 of the conductive layer 120 as illustrated in FIGS. 1D and 1E. Insulating sleeves 140 are placed on one or more mounting posts 145 of the surface mount components 150 prior to insertion of the mounting posts 145 into the through-holes 130. In this manner, the mounting posts 145 are selectively insulated from the layers of the NDEE circuit board 100.

For example, the sleeves 140 can be pre-sized to match particular layers of the NDEE circuit board 100 and placed on the mounting posts 145 before the surface mount components 150 are disposed on the surface of the NDEE circuit board 100. In some embodiments, the sleeves 140 are disposed around the mounting posts 145. In some embodiments, the sleeves 140 are pre-sized and fitted to the mounting posts 145 so that they extend at least from an upper surface of the glass fiber material layer 115 to a lower surface of the carbon material layer 110 when the mounting posts are inserted into the NDEE circuit board 100. In some embodiments, the sleeves 140 are pre-sized and fitted to the mounting posts 145 so that they extend at least from the upper surface of the carbon material layer 110 to a lower surface of the carbon material layer 110 when the mounting posts are inserted into the NDEE circuit board 100. These are but a few examples of how the mounting posts can be selectively insulated from different layers of the NDEE circuit board 100.

The carbon material layer 110 is electrically isolated from the one or more mounting posts 145, any other electrical circuit component of the NDEE circuit board 100, and from earth ground. After forming the one or more through-holes 130, the mounting posts 145 having the sleeves 140 are inserted into the through-holes so that when seated, no part of the mounting posts 145 makes contact with the carbon material layer 110.

In some embodiments, the pre-sized insulating sleeves 140 can be inserted into the through-holes using an insertion tool such as a mandrel, and fitted to the walls of the through-holes prior to insertion of the surface mount component and mounting posts. When the mounting posts 145 of the surface mount component 150 are subsequently inserted into the through-holes 130 and/or 135, the mounting posts slip into the insulating sleeves 140 and are then insulated from the selected layers.

In other words, encapsulation of the carbon material layer 110 by using the pre-measured insulating sleeves 140 on the mounting posts 145 of the surface mount component 150 prevents electrical contact to be established between the carbon material layer 110 and any of the other electrical circuits including earth ground. Put differently, the mounting posts are electrically insulated from selected layers. This also provides the ability to drill and insulate through-holes or vias any time after layup, which provides flexibility in the design of the NDEE circuit board 100, including the pattern 125, the various traces 125, chips 150, and/or components 150 used to finalize the design and/or construction of the NDEE circuit board 100. Inventive aspects include accommodating any circuit layout, including analog and/or digital circuit components and layouts, even when the circuit layout is designed after the "blank" NDEE circuit board 100 is completed. Thus, the NDEE circuit board 100 provides for low noise operation and flexibility in its construction.

Figure 1A:
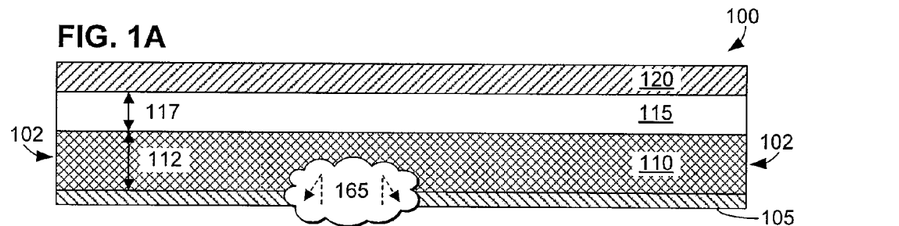
FIGS. 1A-1E illustrate cross sectional views of a noise dampening energy efficient circuit board at various stages of construction, including electromagnetic absorbing carbon elements according to one example embodiment of the present invention.
Figure 1B:
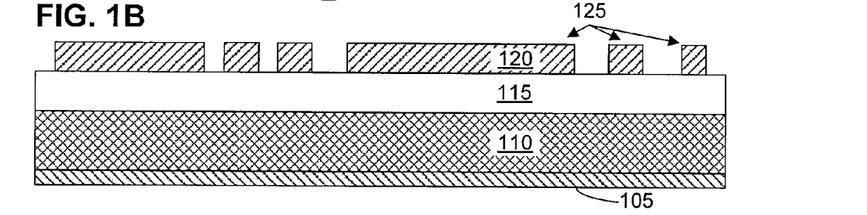
Figure 1C:
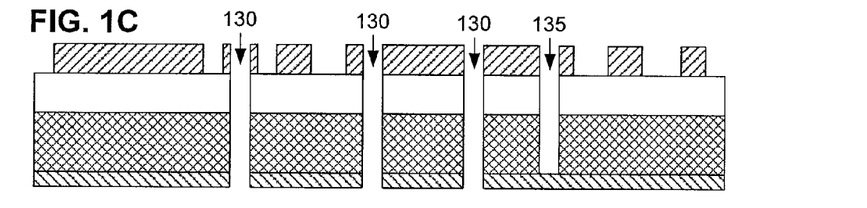
Figure 1D:
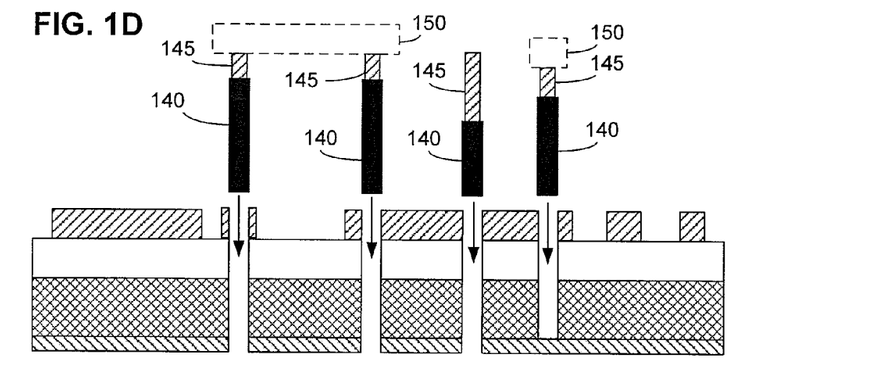
Figure 1E:
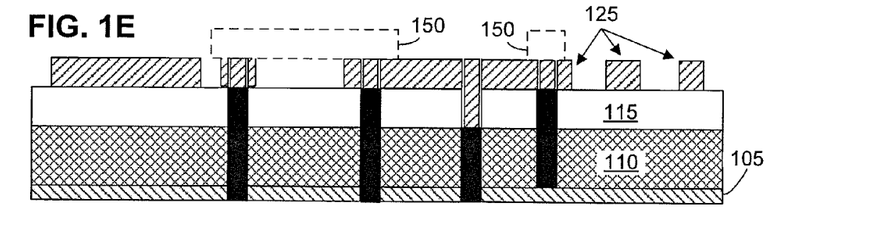
Figure 1F:
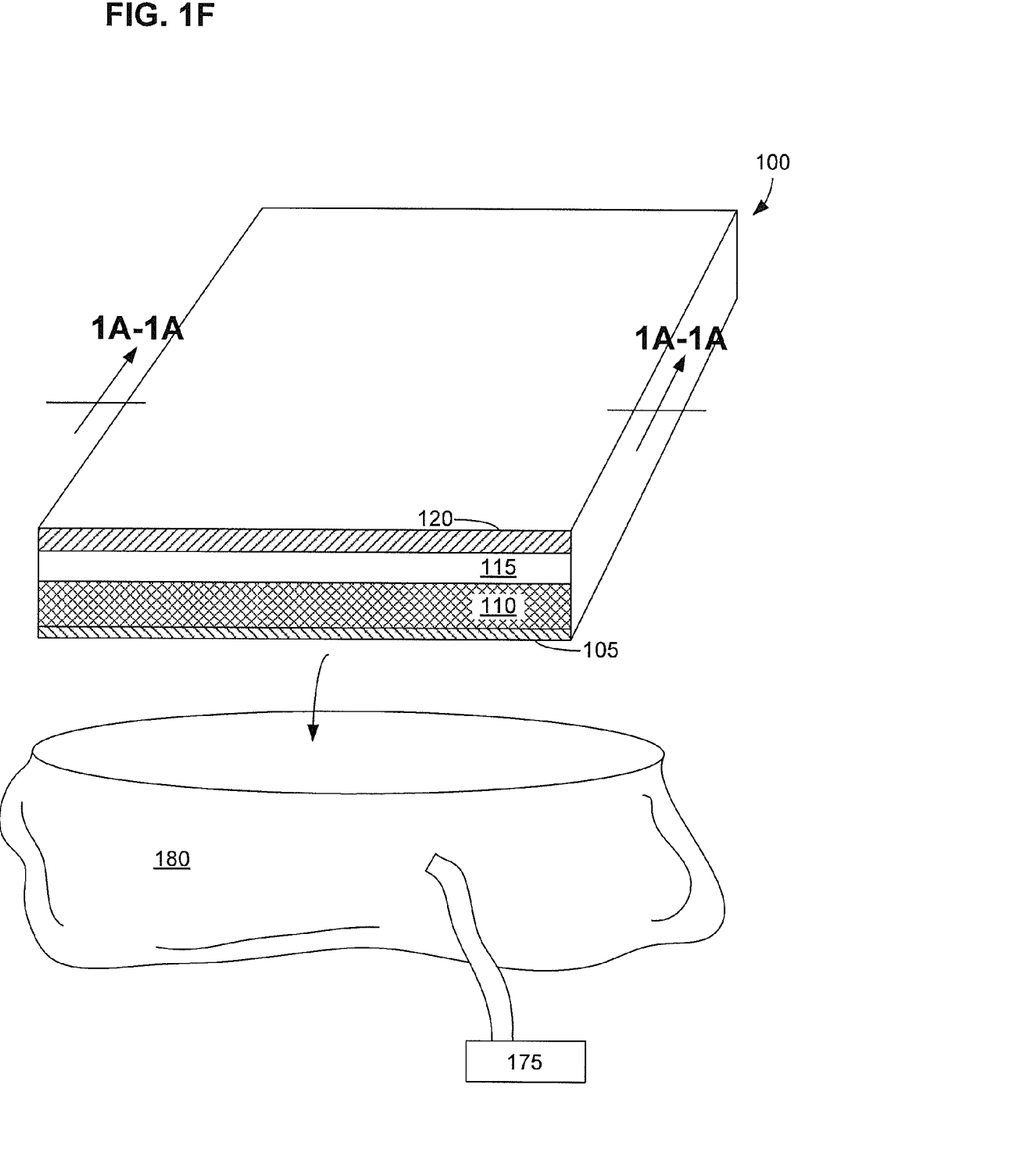
FIG. 1F illustrates a perspective view of an example embodiment of a noise dampening energy efficient circuit board relative to a vacuum bag for vacuum infusion room temperature lamination according to some embodiments.

FIG. 1F illustrates a perspective view of an example embodiment of a noise dampening energy efficient circuit board 100 relative to a vacuum bag 180 for vacuum infusion room temperature lamination according to some embodiments.

After the various circuit board layers are arranged one atop another, at least one of the circuit board layers is infused with epoxy. While conventional techniques use pre-preg or "pre-impregnated" fibers to bond the layers using high temperature as a catalyst, embodiments of the present invention preferably include infusing the carbon material layer 110 with epoxy, and thereafter, inserting the stacked layers into the vacuum bag 180 for vacuum infusion lamination at room temperature. Such a technique reduces heat and energy requirements for constructing the boards. Moreover, energy is conserved by avoiding the use of high-pressure fixtures. Air is extracted from the vacuum bag 180 using air extractor 175, which causes a substantially even distribution of pressure around the stack of layers, and causes adjacent layers to bond one to another. Thus, the layers are fused together by application of pressure during the air extraction at substantially room temperature, thereby forming a single "blank" noise dampening energy efficient circuit board 100.

While FIG. 1F includes sectional lines indicating a cross sectional view of the NDEE circuit board 100 illustrated in FIG. 1A, it should be understood that the NDEE circuit board 100 illustrated in FIG. 1F is representative of any of the variety of NDEE circuit boards illustrated in FIGS. 1A, 2A, 3A, and 4A, any of which can be inserted into the vacuum bag 180 for vacuum infusion lamination at room temperature.

It should be understood that while vacuum infusion at room temperature using a vacuum bag as described herein is one suitable and preferred method for constructing the NDEE circuit board, other methods can be used. For example, the various layers can be laminated, adhered one to another, and/or otherwise bonded one to another using a pressure fixture for applying pressure, a furnace for applying heat greater than room temperature, and/or other suitable devices for causing the various levels to form into a singular NDEE "blank" circuit board.

FIGS. 2A-2E illustrate cross sectional views of a noise dampening energy efficient circuit board 200 at various stages of construction, including electromagnetic absorbing carbon elements according to another example embodiment of the present invention. Reference is now made to FIGS. 2A through 2E.

The NDEE circuit board 200 includes a carbon material layer 210 for dampening electromagnetic noise 265 from interfering with surface mount components 250/252 and traces 225/227 associated with the conductive layers 220/222. In other words, noise 265 generated by surface components 250 is prevented from interfering with surface mount components 252, and vice versa. Further, the carbon material layer 210 is structured to reduce phase shift and dampen electromagnetic noise 265 transmitted between the surface mount components 250 and 252.

The carbon material layer 210 has a particular thickness 212, which can be, for example, up to one (1) millimeter in thickness. In some embodiments, the carbon material layer 210 extends contiguously between the edges 202 of the circuit board 200. The carbon material layer 210 is preferably comprised of or otherwise includes resin-impregnated carbon fiber fabric. In a preferred embodiment, the resin-impregnated carbon fiber fabric has a specific resistance no greater than $100\ \Omega/cm^2$. In some embodiments, the carbon material layer 210 includes carbon nanotube material.

The carbon material layer 210 diminishes the degrading effects of unwanted electromagnetic radiation 265 on signal quality. In other words, the carbon material layer 210 acts as a shielding agent, which absorbs at least a portion of the background noise 265 generated by surface mount components (e.g., 250), and/or external noise sources 265, from becoming introduced into signals transmitted between different layers and/or components of the circuit board 200. As a result, the electromagnetic noise relative to the circuit board, its components, and the signals transmitted among the components, is reduced. The arrangement and dampening characteristics of the carbon material layer 210 contribute to the reduction of noise, or otherwise improve the noise ratio, by approximately 3 Decibels or more for low-frequency applications, and between approximately 1 to 3 Decibels for high-frequency applications.

A conductive layer 220 is disposed on a glass fiber material layer 215, the glass fiber material layer 215 having a particular thickness 218, which can be, for example, up to one (1) millimeter in thickness. The conductive layer 220 is preferably copper (Cu), but can include any suitable conductor including gold (Au), silver (Ag), and so forth. The glass fiber material layer 215 is disposed on the carbon material layer 210.

The carbon material layer 210, having a particular thickness 212, is disposed on a glass fiber material layer 217. The glass fiber material layer 217 is disposed on a conductive layer 222. Layers 222, 217, 210, 215, and 220 are bonded to form the NDEE circuit board 200.

During layup, epoxy can be infused into the carbon material layer 210 and/or other layers. The various layers can then be vacuum-infused, laminated, and/or bonded at room temperature as further described in detail above. This process results in a "blank" board 200, which can then be patterned, drilled, and/or stacked to accommodate any connection or chip type after layup. Moreover, through-holes or vias can be created in the board 200 after layup, and selectively insulated, which is also described in additional detail below.

After forming the "blank" NDEE circuit board 200, the conductive layer 220 can be eventually etched or otherwise formed into a pattern 225, leaving only the desired conductive traces 225. Similarly, the conductive layer 222 can be eventually etched or otherwise formed into a pattern 227, leaving only the desired conductive traces 227. It should be understood that any suitable method for forming or etching the patterns 225 and 227 can be used, including silk screen printing, photographic or photomask methods, laser-printed resist or ablation, and/or milling, among other suitable methods.

Figure 2A:
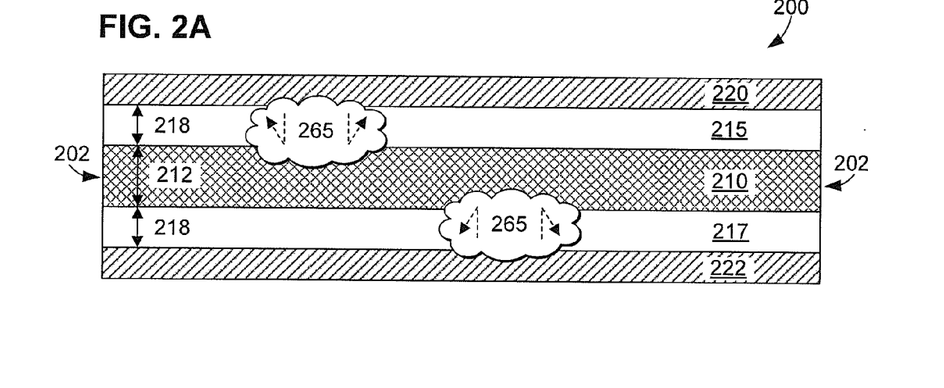
FIGS. 2A-2E illustrate cross sectional views of a noise dampening energy efficient circuit board at various stages of construction, including electromagnetic absorbing carbon elements according to another example embodiment of the present invention.
Figure 2B:
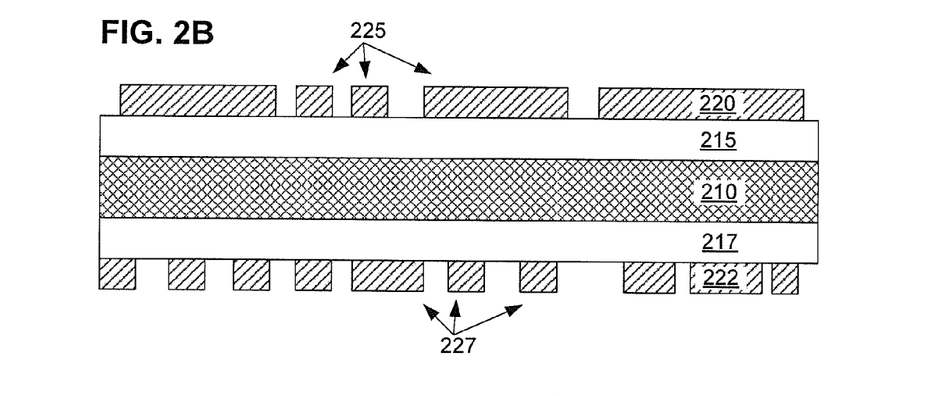
Figure 2C:
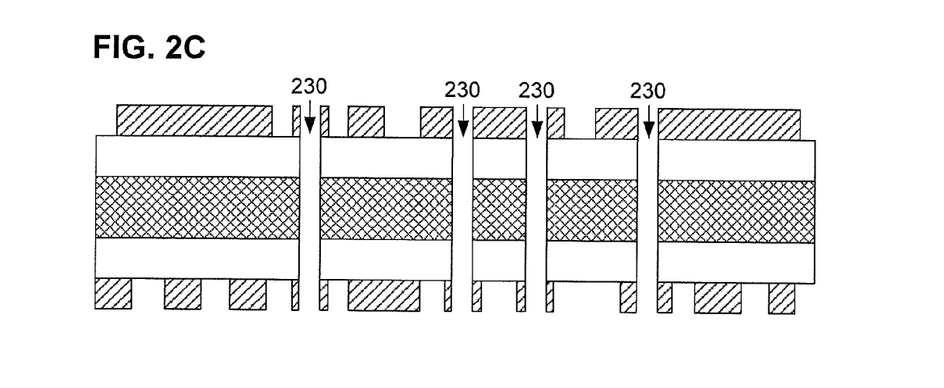
Figure 2D:
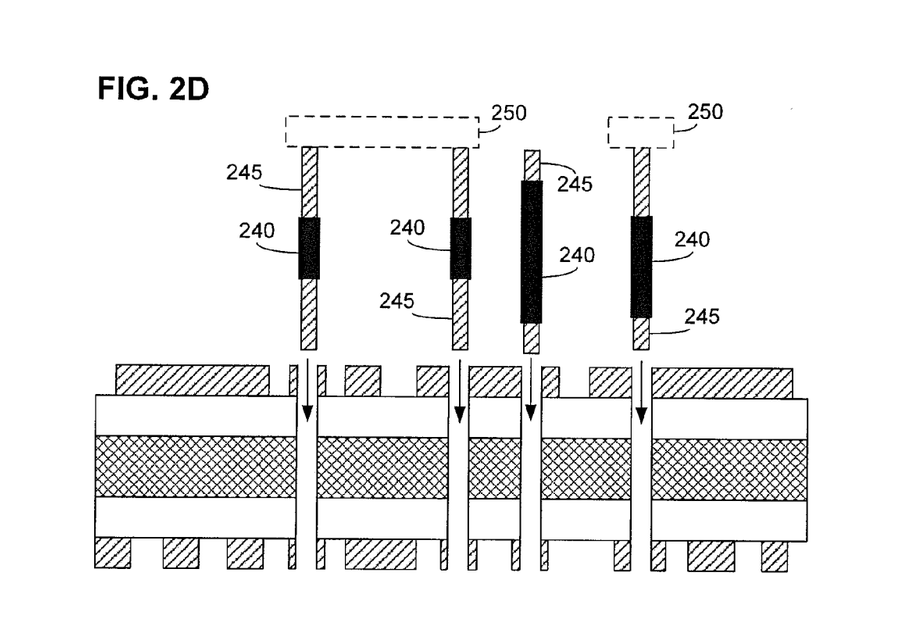
Figure 2E:
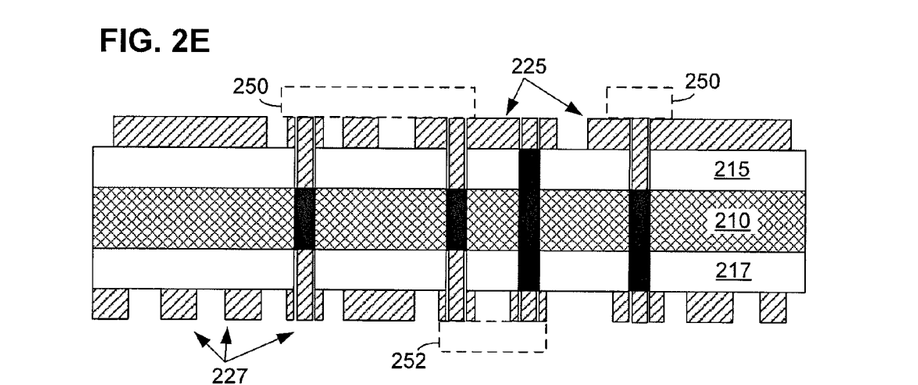

One or more through-holes 230 can be drilled or otherwise created in the NDEE circuit board 200 after layup, and either before or after forming the patterns 225 and 227 in the conductive layers. The through-holes 230 can extend fully or partially through the various layers 220, 215, 210, 217 and/or 222 of the NDEE circuit board 200. One or more surface mount components 250 can be disposed on the conductive pattern 225 of the conductive layer 220 as illustrated in FIGS. 2D and 2E. In addition, one or more surface mount components 252 can be disposed on the conductive pattern 227 of the conductive layer 222. Insulating sleeves 240 are placed on one or more mounting posts 245 of the surface mount components 250 and/or 252 prior to insertion of the mounting posts 245 into the through-holes 230. In this manner, the mounting posts 245 are selectively insulated from the layers of the NDEE circuit board 200.

For example, the sleeves 240 can be pre-sized to match particular layers of the NDEE circuit board 200 and placed on the mounting posts 245 before the surface mount components 250 and/or 252 are disposed on the surfaces of the NDEE circuit board 200. In some embodiments, the sleeves 240 are disposed around the mounting posts 245.

In some embodiments, the sleeves 240 are pre-sized and fitted to the mounting posts 245 so that they extend at least from an upper surface of the glass fiber material layer 215 to a lower surface of the carbon material layer 210 when the mounting posts are inserted into the NDEE circuit board 200. In some embodiments, the sleeves 240 are pre-sized and fitted to the mounting posts 245 so that they extend at least from an upper surface of the glass fiber material layer 215 to a lower surface of the glass fiber material layer 217 when the mounting posts are inserted into the NDEE circuit board 200.

In some embodiments, the sleeves 240 are pre-sized and fitted to the mounting posts 245 so that they extend at least from the upper surface of the carbon material layer 210 to a lower surface of the carbon material layer 210 when the mounting posts are inserted into the NDEE circuit board 200. In some embodiments, the sleeves 240 are pre-sized and fitted to the mounting posts 245 so that they extend at least from an upper surface of the carbon material layer 210 to a lower surface of the glass fiber material layer 217 when the mounting posts are inserted into the NDEE circuit board 200. These are but a few examples of how the mounting posts can be selectively insulated from different layers of the NDEE circuit board 200.

The carbon material layer 210 is electrically isolated from the one or more mounting posts 245, any other electrical circuit component of the NDEE circuit board 200, and from earth ground. After forming the one or more through-holes 230, the mounting posts 245 having the sleeves 240 are inserted into the through-holes so that when seated, no part of the mounting posts 245 makes contact with the carbon material layer 210.

In some embodiments, the pre-sized insulating sleeves 240 can be inserted into the through-holes using an insertion tool such as a mandrel, and fitted to the walls of the through-holes prior to insertion of the surface mount component and mounting posts. When the mounting posts 245 of the surface mount component 250 and/or 252 are subsequently inserted into the through-holes 230, the mounting posts slip into the insulating sleeves 240 and are then insulated from the selected layers.

In other words, encapsulation of the carbon material layer 210 by using the pre-measured insulating sleeves 240 on the mounting posts 245 of the surface mount component 250 prevents electrical contact to be established between the carbon material layer 210 and any of the other electrical circuits including earth ground. Put differently, the mounting posts are electrically insulated from selected layers. This also provides the ability to drill and insulate through-holes or vias any time after layup, which provides flexibility in the design of the NDEE circuit board 200, including the patterns 225/227, the various traces 225/227, chips and/or components 250/252 used to finalize the design and/or construction of the NDEE circuit board 200. Inventive aspects include accommodating any circuit layout, including analog and/or digital circuit components and layouts, even when the circuit layout is designed after the "blank" NDEE circuit board 200 is completed. Thus, the NDEE circuit board 200 provides for low noise operation and flexibility in its construction.

FIGS. 3A-3E illustrate cross sectional views of a noise dampening energy efficient circuit board 300 at various stages of construction, including electromagnetic absorbing carbon elements according to another example embodiment of the present invention. Reference is now made to FIGS. 3A through 3E.

The NDEE circuit board 300 includes a carbon material layer 310 for dampening electromagnetic noise 365 relative to conductive layer 320. The carbon material layer 310 has a particular thickness 312, which can be, for example, up to one (1) millimeter in thickness. In some embodiments, the carbon material layer 310 extends contiguously between the edges 302 of the circuit board 300. The carbon material layer 310 is preferably comprised of or otherwise includes resin-impregnated carbon fiber fabric. In a preferred embodiment, the resin-impregnated carbon fiber fabric has a specific resistance no greater than 100 $\Omega/cm^2$. In some embodiments, the carbon material layer 310 includes carbon nanotube material.

The carbon material layer 310 diminishes the degrading effects of unwanted electromagnetic radiation 365 on signal quality. In other words, the carbon material layer 310 acts as a shielding agent, which absorbs at least a portion of the background noise 365 generated by surface mount components (e.g., 350), and/or external noise sources 365, from becoming introduced into signals transmitted between different layers and/or components of the circuit board 300. As a result, the electromagnetic noise relative to the circuit board, its components, and the signals transmitted among the components, is reduced. The arrangement and dampening characteristics of the carbon material layer 310 contribute to the reduction of noise, or otherwise improve the noise ratio, by approximately 3 Decibels or more for low-frequency applications, and between approximately 1 to 3 Decibels for high-frequency applications.

A conductive layer 320 is disposed on a glass fiber material layer 315, the glass fiber material layer 315 having a particular thickness 318, which can be, for example, up to one (1) millimeter in thickness. The conductive layer 320 is preferably copper (Cu), but can include any suitable conductor including gold (Au), silver (Ag), and so forth. The glass fiber material layer 315 is disposed on a ground plane layer 321, which can also be referred to as a signal ground plane layer 321 or a signal layer 321.

In some embodiments, the ground plane layer 321 extends contiguously between the edges 302 of the NDEE circuit board 300. In some embodiments, a pattern of holes or dimples are distributed evenly or unevenly through or on the ground plane layer 321 to further repel and/or tune microwave energies or other signal frequencies. The ground plane layer 321 preferably includes copper (Cu), but can include any suitable conductor including gold (Au), silver (Ag), Aluminum (Al) and so forth. The ground plane layer 321 has a particular thickness 322, which is designed to be thicker for higher frequency signals and thinner for lower frequency signals. The particular thickness 322 can be, for example, up to one (1) millimeter in thickness. The positioning of the carbon material layer 310 with respect to the ground plane layer 321 enhances the ground plane operation, reduces noise, and improves performance characteristics of the NDEE circuit board 300. Moreover, the relative placement of the carbon material layer 310 to the ground plane layer 321 results in desirable noise reduction and allows for significant energy efficiency gains.

The ground plane layer 321 is disposed on an insulating dielectric layer 307. The dielectric layer 307 is designed to be thicker for higher frequency signals and thinner for lower frequency signals. More specifically, the insulating dielectric layer 307 is thinner than the thickness 312 of the carbon material layer 310 and the thickness 318 of the glass fiber material layer 315. The dielectric layer 307 can be any suitable insulator or dielectric, including glass fiber material. The insulating dielectric layer 307 is disposed on the carbon material layer 310. The carbon material layer 310 is disposed on a dielectric layer 305, which is similar to or the same as the dielectric layer 307 in composition and dimensions.

Layers 305, 310, 307, 321, 315, and 320 are bonded to form the NDEE circuit board 300. The carbon material layer 310 and the ground plane layer 321 cooperatively dampen electromagnetic noise 365 from interfering with the surface mount components 350 and traces 325 associated with the conductive layer 320.

During layup, epoxy can be infused into the carbon material layer 310 and/or other layers. The various layers can then be vacuum-infused, laminated, and/or bonded at room temperature as further described in detail above. This process results in a "blank" board 300, which can then be patterned, drilled, and/or stacked to accommodate any connection or chip type after layup. Moreover, through-holes or vias can be created in the board 300 after layup, and selectively insulated, which is also described in additional detail below.

After forming the "blank" NDEE circuit board 300, the conductive layer 320 can be eventually etched or otherwise formed into a pattern 325, leaving only the desired conductive traces 325. It should be understood that any suitable method for forming or etching the pattern 325 can be used, including silk screen printing, photographic or photomask methods, laser-printed resist or ablation, and/or milling, among other suitable methods.

Figure 3A:
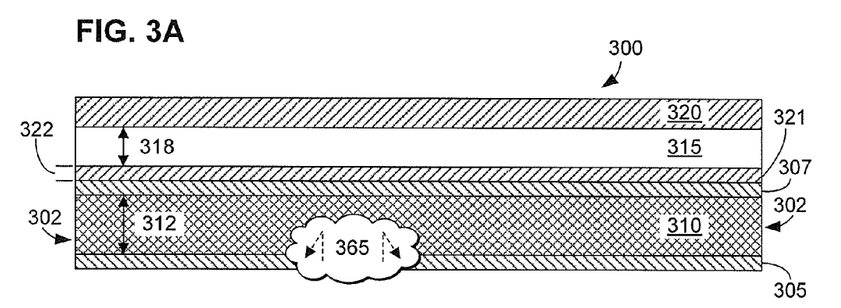
FIGS. 3A-3E illustrate cross sectional views of a noise dampening energy efficient circuit board at various stages of construction, including electromagnetic absorbing carbon elements according to another example embodiment of the present invention.
Figure 3B:
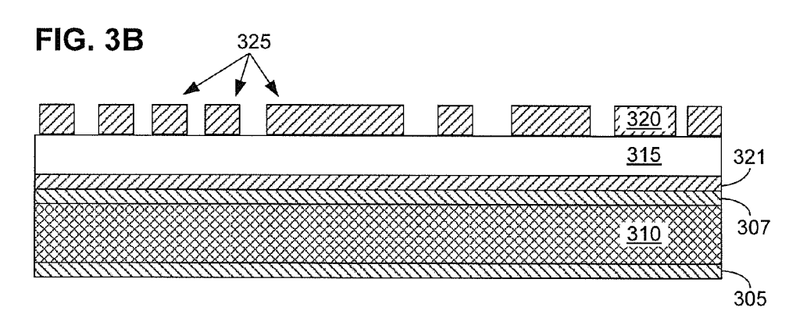
Figure 3C:
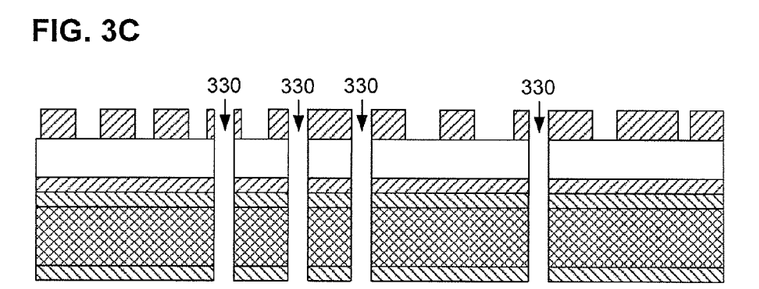
Figure 3D:
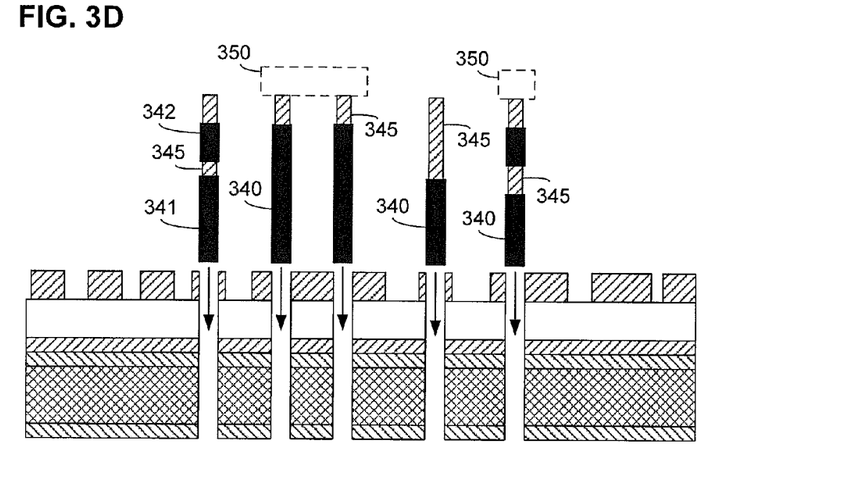
Figure 3E:
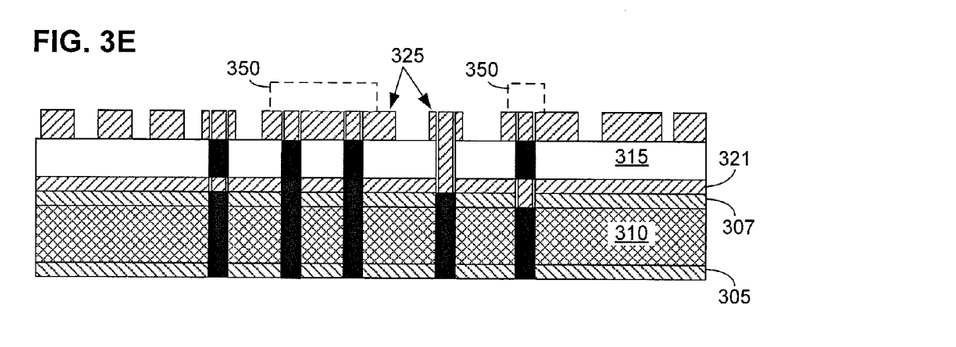

One or more through-holes 330 can be drilled or otherwise created in the NDEE circuit board 300 after layup, and either before or after forming the pattern 325 in the conductive layer 320. The through-holes 330 can extend fully or partially through the various layers 320, 315, 321, 307, 310 and/or 305 of the NDEE circuit board 300. One or more surface mount components 350 can be disposed on the conductive pattern 325 of the conductive layer 320 as illustrated in FIGS. 3D and 3E. Insulating sleeves 340 are placed on one or more mounting posts 345 of the surface mount components 350 prior to insertion of the mounting posts 345 into the through-holes 330. In this manner, the mounting posts 345 are selectively insulated from the layers of the NDEE circuit board 300.

For example, the sleeves 340 can be pre-sized to match particular layers of the NDEE circuit board 300 and placed on the mounting posts 345 before the surface mount components 350 are disposed on the surface of the NDEE circuit board 300. In some embodiments, the sleeves 340 are disposed around the mounting posts 345. The surface mount components 350 having the one or more insulated mounting posts 345 are inserted in the through-holes 330 so that the sleeves 340 selectively insulate the mounting posts 345 from at least one layer of the circuit board.

In some embodiments, the sleeves 340 are pre-sized and fitted to the mounting posts 345 so that they insulate the mounting posts 345 from at least one or both of the ground plane layer 321 and the carbon material layer 310 when the mounting posts are inserted into the NDEE circuit board 300. In some embodiments, the sleeves 340 are pre-sized and fitted to the mounting posts 345 so that they extend between a subset of the total number of layers when the mounting posts are inserted into the NDEE circuit board 300, as illustrated in FIG. 3E.

The carbon material layer 310 is electrically isolated from the one or more mounting posts 345, any other electrical circuit component of the NDEE circuit board 300, and from earth ground. After forming the one or more through-holes 330, the mounting posts 345 having the sleeves 340 are inserted into the through-holes so that when seated, no part of the mounting posts 345 makes contact with the carbon material layer 310.

In some embodiments, the pre-sized insulating sleeves 340 can be inserted into the through-holes using an insertion tool such as a mandrel, and fitted to the walls of the through-holes prior to insertion of the surface mount component and mounting posts. When the mounting posts 345 of the surface mount component 350 are subsequently inserted into the through-holes 330, the mounting posts slip into the insulating sleeves 340 and are then insulated from the selected layers.

In other words, encapsulation of the carbon material layer 310 by using the pre-measured insulating sleeves 340 on the mounting posts 345 of the surface mount component 350 prevents electrical contact to be established between the carbon material layer 310 and any of the other electrical circuits including earth ground. Put differently, the mounting posts are electrically insulated from selected layers. This also provides the ability to drill and insulate through-holes or vias any time after layup, which provides flexibility in the design of the NDEE circuit board 300, including the pattern 325, the various traces 325, chips and/or components 350 used to finalize the design and/or construction of the NDEE circuit board 300.

In some embodiments a mounting post 345 has associated therewith two or more separate insulating sleeves, such as 341 and 342. This provides the ability to insulate different non-adjacent layers of the NDEE circuit board 300 from having electrical contact with the mounting posts 345.

Inventive aspects include accommodating any circuit layout, including analog and/or digital circuit components and layouts, even when the circuit layout is designed after the "blank" NDEE circuit board 300 is completed. Thus, the NDEE circuit board 300 provides for low noise operation and flexibility in its construction.

FIGS. 4A-4E illustrate cross sectional views of a noise dampening energy efficient circuit board 400 at various stages of construction, including electromagnetic absorbing carbon elements according to another example embodiment of the present invention. Reference is now made to FIGS. 4A through 4E.

The NDEE circuit board 400 includes a carbon material layer 410 for dampening electromagnetic noise 465 from interfering with surface mount components 450/452 and traces 425/427 associated with the conductive layers 420/422. In other words, noise 465 generated by surface components 450 is prevented from interfering with surface mount components 452, and vice versa. Further, the carbon material layer 410 is structured to reduce phase shift and dampen electromagnetic noise 465 transmitted between the surface mount components 450 and 452.

The carbon material layer 410 has a particular thickness 412, which can be, for example, up to one (1) millimeter in thickness. In some embodiments, the carbon material layer 410 extends contiguously between the edges 402 of the circuit board 400. The carbon material layer 410 is preferably comprised of or otherwise includes resin-impregnated carbon fiber fabric. In a preferred embodiment, the resin-impregnated carbon fiber fabric has a specific resistance no greater than 100 $\Omega/cm^2$. In some embodiments, the carbon material layer 410 includes carbon nanotube material.

The carbon material layer 410 diminishes the degrading effects of unwanted electromagnetic radiation 465 on signal quality. In other words, the carbon material layer 410 acts as a shielding agent, which absorbs at least a portion of the background noise 465 generated by surface mount components (e.g., 450 and 452), and/or external noise sources 465, from becoming introduced into signals transmitted between different layers and/or components of the circuit board 400. As a result, the electromagnetic noise relative to the circuit board, its components, and the signals transmitted among the components, is reduced. The arrangement and dampening characteristics of the carbon material layer 410 contribute to the reduction of noise, or otherwise improve the noise ratio, by approximately 3 Decibels or more for low-frequency applications, and between approximately 1 to 3 Decibels for high-frequency applications.

A conductive layer 420 is disposed on a glass fiber material layer 415, the glass fiber material layer 415 having a particular thickness 418, which can be, for example, up to one (1) millimeter in thickness. The conductive layer 420 is preferably copper (Cu), but can include any suitable conductor including gold (Au), silver (Ag), and so forth. The glass fiber material layer 415 is disposed on a ground plane layer 421, which can also be referred to as a signal ground plane layer 421 or a signal layer 421.

In some embodiments, the ground plane layer 421 extends contiguously between the edges 402 of the NDEE circuit board 400. In some embodiments, a pattern of holes or dimples are distributed evenly or unevenly through or on the ground plane layer 421 to further repel and/or tune microwave energies or other signal frequencies. The ground plane layer 421 preferably includes copper (Cu), but can include any suitable conductor including gold (Au), silver (Ag), Aluminum (Al) and so forth. The ground plane layer 421 has a particular thickness 422, which is designed to be thicker for higher frequency signals and thinner for lower frequency signals. The particular thickness 422 can be, for example, up to one (1) millimeter in thickness The ground plane layer 421 is disposed on an insulating dielectric layer 407. The dielectric layer 407 is designed to be thicker for higher frequency signals and thinner for lower frequency signals. More specifically, the insulating dielectric layer 407 is thinner than the thickness 412 of the carbon material layer 410 and the thickness 418 of the glass fiber material layer 415. The dielectric layer 407 can be any suitable insulator or dielectric, including glass fiber material. The insulating dielectric layer 407 is disposed on the carbon material layer 410. The carbon material layer 410 is disposed on a dielectric layer 405, which is similar to or the same as the dielectric layer 407 in composition and dimensions. The dielectric layer 405 and the dielectric layer 407 have a particular thickness less than the particular thickness 418 of the glass fiber material layers 415 and 417.

The dielectric layer 405 is disposed on a ground plane layer 423, which is similar to or the same as the ground plane layer 421 in composition and dimensions, and can also be referred to as a signal ground plane layer 423 or a signal layer 423. The carbon material layer 410 and the ground plane layers 421/423 cooperatively dampen electromagnetic noise 465 from interfering with the surface mount components 450/452 and traces 425/427 associated with the conductive layer 420/422. In other words, the arrangement of the carbon material layer 410 works cooperatively with the arrangement of the two ground plane layers 421 and 423 to prevent the noise 465 generated by the surface components 450 from interfering with surface mount components 452, and visa vice versa.

The positioning of the carbon material layer 410 with respect to the ground plane layers 421 and 423 enhances the operation of the ground plane layers, reduces noise, and improves performance characteristics of the NDEE circuit board 400. Moreover, the relative placement of the carbon material layer 410 to the ground plane layers 421 and 423 results in desirable noise reduction and allows for significant energy efficiency gains.

The ground plane layer 423 is disposed on the glass fiber material layer 417. The glass fiber material layer 417, which can have the particular thickness 418 of the glass fiber material layer 415, is disposed on the conductive layer 422. Layers 422, 417, 423, 405, 410, 407, 421, 415, and 420 are bonded to form the NDEE circuit board 400.

During layup, epoxy can be infused into the carbon material layer 410 and/or other layers. The various layers can then be vacuum-infused, laminated, and/or bonded at room temperature as further described in detail above. This process results in a "blank" board 400, which can then be patterned, drilled, and/or stacked to accommodate any connection or chip type after layup. Moreover, through-holes or vias can be created in the board 400 after layup, and selectively insulated, which is also described in additional detail below.

After forming the "blank" NDEE circuit board 400, the conductive layer 420 can be eventually etched or otherwise formed into a pattern 425, leaving only the desired conductive traces 425. Similarly, the conductive layer 422 can be eventually etched or otherwise formed into a pattern 427, leaving only the desired conductive traces 427. It should be understood that any suitable method for forming or etching the patterns 425 and 427 can be used, including silk screen printing, photographic or photomask methods, laser-printed resist or ablation, and/or milling, among other suitable methods.

Figure 4A:
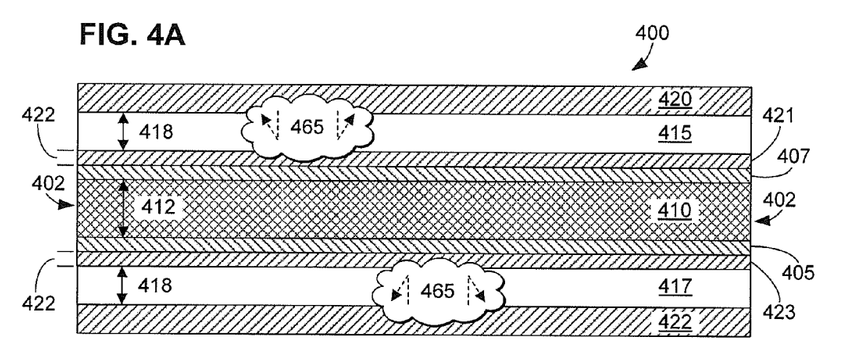
FIGS. 4A-4E illustrate cross sectional views of a noise dampening energy efficient circuit board at various stages of construction, including electromagnetic absorbing carbon elements according to another example embodiment of the present invention.
Figure 4B:
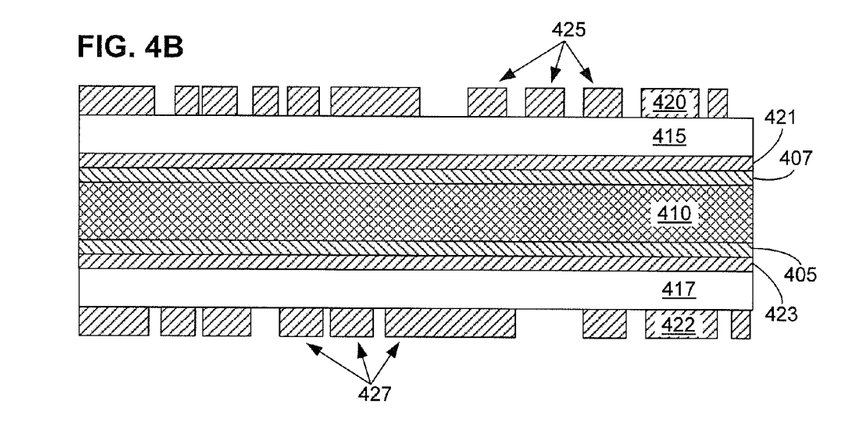
Figure 4C:
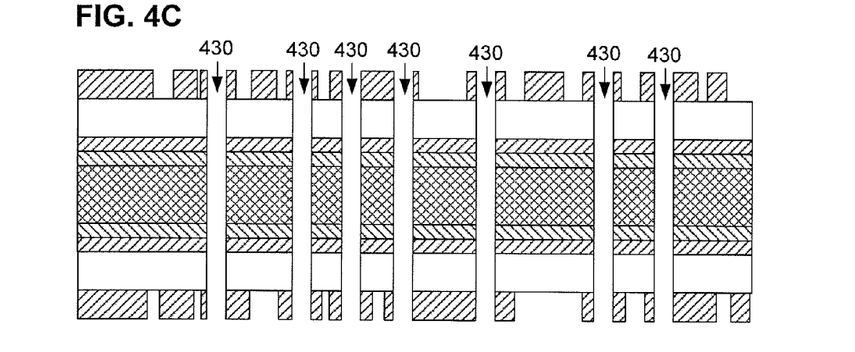
Figure 4D:
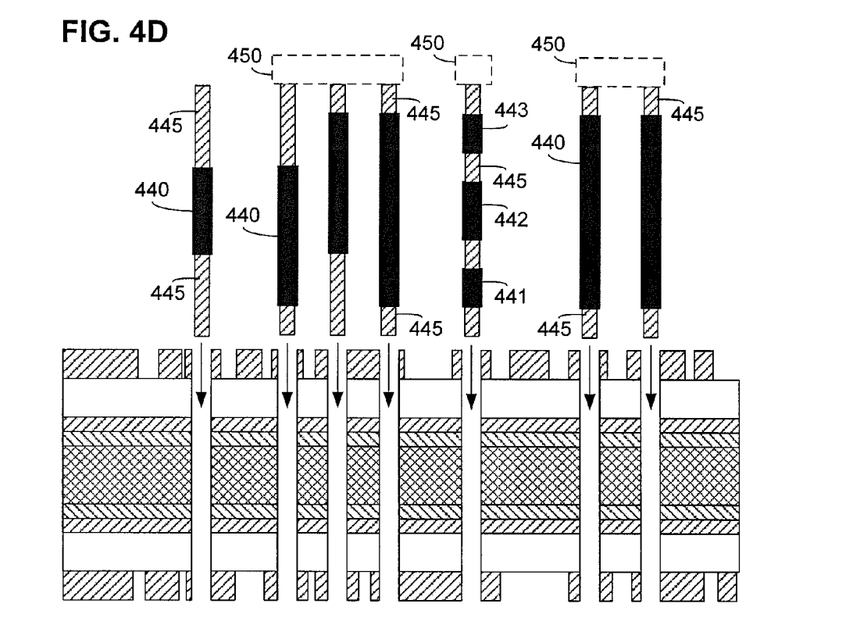
Figure 4E:
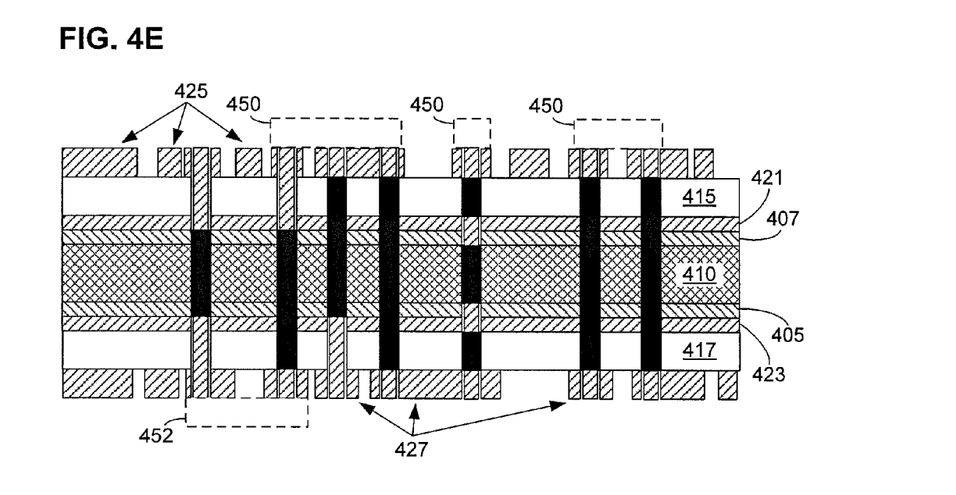

One or more through-holes 430 can be drilled or otherwise created in the NDEE circuit board 400 after layup, and either before or after forming the patterns 425 and 427 in the conductive layers. The through-holes 430 can extend fully or partially through the various layers 420, 415, 421, 407, 410, 405, 423, 417 and/or 422 of the NDEE circuit board 400. One or more surface mount components 450 can be disposed on the conductive pattern 425 of the conductive layer 420 as illustrated in FIGS. 4D and 4E. In addition, one or more surface mount components 452 can be disposed on the conductive pattern 427 of the conductive layer 422. Insulating sleeves 440 are placed on one or more mounting posts 445 of the surface mount components 450 and/or 452 prior to insertion of the mounting posts 445 into the through-holes 430. In this manner, the mounting posts 445 are selectively insulated from the layers of the NDEE circuit board 400.

For example, the sleeves 440 can be pre-sized to match particular layers of the NDEE circuit board 400 and placed on the mounting posts 445 before the surface mount components 450 and/or 452 are disposed on the surfaces of the NDEE circuit board 400. In some embodiments, the sleeves 440 are disposed around the mounting posts 445.

In some embodiments, the sleeves 440 are pre-sized and fitted to the mounting posts 445 so that they insulate the mounting posts 445 from at least one or all of the ground plane layers 421/423 and the carbon material layer 410 when the mounting posts are inserted into the NDEE circuit board 400. In some embodiments, the sleeves 440 are pre-sized and fitted to the mounting posts 445 so that they extend between a subset of the total number of layers when the mounting posts are inserted into the NDEE circuit board 400, as illustrated in FIG. 4E.

The carbon material layer 410 is electrically isolated from the one or more mounting posts 445, any other electrical circuit component of the NDEE circuit board 400, and from earth ground. After forming the one or more through-holes 430, the mounting posts 445 having the sleeves 440 are inserted into the through-holes so that when seated, no part of the mounting posts 445 makes contact with the carbon material layer 410.

In some embodiments, the pre-sized insulating sleeves 440 can be inserted into the through-holes using an insertion tool such as a mandrel, and fitted to the walls of the through-holes prior to insertion of the surface mount component and mounting posts. When the mounting posts 445 of the surface mount component 450 and/or 452 are subsequently inserted into the through-holes 430, the mounting posts slip into the insulating sleeves 440 and are then insulated from the selected layers.

In other words, encapsulation of the carbon material layer 410 by using the pre-measured insulating sleeves 440 on the mounting posts 445 of the surface mount component 450 prevents electrical contact to be established between the carbon material layer 410 and any of the other electrical circuits including earth ground. Put differently, the mounting posts are electrically insulated from selected layers. This also provides the ability to drill and insulate through-holes or vias any time after layup, which provides flexibility in the design of the NDEE circuit board 400, including the patterns 425/427, the various traces 425/427, chips and/or components 450/452 used to finalize the design and/or construction of the NDEE circuit board 400.

In some embodiments a mounting post 445 has associated therewith three or more separate insulating sleeves, such as 441, 442, and 443. This provides the ability to insulate different non-adjacent layers of the NDEE circuit board 400 from having electrical contact with the mounting posts 445.

Inventive aspects include accommodating any circuit layout, including analog and/or digital circuit components and layouts, even when the circuit layout is designed after the "blank" NDEE circuit board 400 is completed. Thus, the NDEE circuit board 400 provides for low noise operation and flexibility in its construction.

While some examples of noise dampening and energy efficient circuit board types and configurations are disclosed herein, persons with skill in the art will recognize that the inventive concepts disclosed herein can be implemented with a variety of different circuit board types, shapes, and forms. The thickness of each of the various layers including the carbon material layer, the ground plane layers, the glass fiber material layers, and/or the insulating dielectric layers, can be, for example, up to one (1) millimeter in thickness, although in practice, some layers are designed to be thicker than other layers, as set forth in detail above.

The carbon material layer can be woven carbon fiber fabric. In some embodiments, the woven carbon fiber fabric is such that the strands of the fabric are randomly oriented. In some embodiments, particularly for high frequency signal environments, the woven carbon fiber fabric is such that a pattern in the fabric matches a trace pattern etched into the conductive layer. Put differently, certain strands of the carbon fiber fabric can be oriented in a direction that is the same or similar to certain traces etched into the conductive layer. The remaining portions of the carbon material layer can be oriented in a random pattern or otherwise cut out altogether.

More specifically, the carbon material layer can include strands or threads that extend for substantially the length or width of the carbon material layer. In some embodiments, the strands or threads can be substantially oriented in the same direction. In some embodiments, the strands or threads can be oriented in different directions. In some embodiments, the strands or threads can be arranged to be co-linear with circuit traces, or otherwise match a pattern of circuit traces etched from the conductive layer. In some embodiments, portions or all of the carbon material layer are woven in a pattern. In some embodiments, the weave pattern is biased in a certain direction, such as at a 45 degree angle relative to the edges of the circuit board. In this manner, electrons can travel along certain paths or patterns in the carbon material layer, allowing the electromagnetic noise characteristics of the circuit board to be controlled. It should be understood that the weave pattern can be designed to include other forms or patterns depending on the qualities and noise characteristics of a particular circuit board.

As another example, NDEE circuit board type 300 can be stacked to and bonded with NDEE circuit board type 400 to form a multi-layered and multi-type NDEE circuit board. Moreover, NDEE circuit board type 100 can be stacked to and bonded with NDEE circuit board type 200 to form a multi-layered and multi-type NDEE circuit board of a different nature. Indeed, any of the NDEE circuit board types 100, 200, 300, and/or 400 can be stacked to and bonded one to another to form complex multi-layered boards having noise dampening qualities dispersed therein. In some embodiments, the NDEE circuit board boards preferably have one ground plane layer for each outer circuit layer (i.e., trace pattern), in which the ground plane layer is disposed between and adjacent to the carbon material layer and the outer circuit layer. In some embodiments, the carbon material layer is disposed between and adjacent to two different ground plane layers. Thus, higher frequency signals are supported in a lower-noise environment.

Power and energy efficiencies are also improved. For instance, as the noise qualities of a PCB are improved, the signal qualities also improve, and the resulting circuits can operate with lower voltages, use fewer parts, less power, and so forth. Battery operated circuit boards can draw less energy from the batteries, thereby extending the lifecycle of the battery, and reducing the amount of waste produced by discarded batteries and other components. Server farms use massive amounts of energy to operate multiple circuit boards and other components, sometimes 24 hours per day, 365 days per year. In other words, the power consumption characteristics and energy efficiencies associated with the NDEE circuit board are significantly improved, and can reduce these demands on the energy infrastructure. Given that there are millions of circuit boards in existence, such power and energy improvements can quickly multiply into significant reductions in power usage, battery production and disposal, etc., thereby boosting conservations efforts worldwide.

Methods for construction and using the NDEE circuit board are also contemplated as described herein. For example, a method for constructing a noise dampening energy efficient circuit board (e.g., 100/200/300/400) can include arranging a plurality of circuit board layers one atop another, infusing epoxy into at least one of the circuit board layers, inserting the plurality of circuit board layers into a vacuum bag (180), extracting air from the vacuum bag, and infusing the plurality of circuit board layers together by application of pressure during the air extraction at substantially room temperature. Infusing epoxy can include infusing the epoxy into a carbon material layer (e.g., 110/210/310/410).

The method can further include forming a single board (e.g., 300/400) having the plurality of layers, the plurality of layers including: a first insulating dielectric layer (e.g., 305/405), the carbon material layer (e.g., 310/410) disposed on the first dielectric layer (e.g., 305/405), the carbon material layer extending contiguously between the edges (e.g., 302/402) of the circuit board; a second insulating dielectric layer (e.g., 307/407) disposed on the carbon material layer (e.g., 310/410); a ground plane layer (e.g., 321/421) disposed on the second dielectric layer e.g., (307/407), the ground plane layer extending contiguously between the edges (e.g., 302/402) of the circuit board; a glass fiber material layer (e.g., 315/415) having a particular thickness, the glass fiber material layer disposed on the ground plane layer (e.g., 321/421); and a conductive layer (e.g., 320/420) configured to be formed into a pattern (e.g., 325/425), the conductive layer (e.g., 320/420) disposed on the glass fiber material layer (e.g., 315/415).

After all of the layers of the circuit board are fused into the single board, the method can include forming the pattern (e.g., 325/425) in the conductive layer (e.g., 320/420), and forming one or more through-holes (e.g., 330/430) in each of the layers. Insulating sleeve (e.g., 340/440) can be disposed around mounting posts (e.g., 345/445) of a surface mount component (e.g., 350/450).

After forming the one or more through-holes (e.g., 330/430) in each of the layers, the method can include disposing the mounting posts (e.g., 345/445) into the one or more through-holes so that the sleeves (e.g., 340/440) selectively insulate the mounting posts from at least one of the ground plane layer (e.g., 321/421) and the carbon material layer (e.g., 310/410).

The method can further include disposing the surface mount component (e.g., 350/450) on an upper surface of the conductive layer (e.g., 320/420); and after forming the one or more through-holes (e.g., 330/430) in each of the layers, inserting the mounting posts (e.g., 345/445) having the sleeves (e.g., 340/440) into the one or more through-holes (e.g., 330/430) so that when seated, no part of the mounting posts (e.g., 345/445) makes contact with the carbon material layer (e.g., 310/410).

The ground plane layer (e.g., 321/421) can include a first ground plane layer (e.g., 321/421), the glass fiber material layer (e.g., 315/415) can comprise a first glass fiber material layer (e.g., 315/415), the conductive layer (e.g., 320/420) can comprise a first conductive layer (e.g., 320/420), and the pattern (e.g., 325/425) can comprise a first pattern (e.g., 325/425). The plurality of layers can be used to form the single board.

The single board can further include: a second conductive layer (e.g., 422) configured to be formed into a second pattern (e.g., 427); a second glass fiber material layer (e.g., 417) having the particular thickness of the first glass fiber material layer (e.g., 415), the second glass fiber material layer (e.g., 417) disposed on the second conductive layer (e.g., 422); and a second ground plane layer (e.g., 423) disposed on the second glass fiber material layer (e.g., 417), the second ground plane layer (e.g., 423) extending contiguously between the edges (e.g., 402) of the circuit board.

The first dielectric layer (e.g., 405) and the second dielectric layer (e.g., 407) can have a particular thickness less than the particular thickness of the first and second glass fiber material layers (e.g., 415/417). The first dielectric layer (e.g., 405) is disposed on the second ground plane layer (e.g., 423) prior to insertion of the plurality of layers into the vacuum bag (180).

The surface mount component (e.g., 350/450) can include a first surface mount component (e.g., 350/450). The method can further include: forming an insulating sleeve (e.g., 440) around mounting posts (e.g., 445) of a second surface mount component (e.g., 452); disposing the second surface mount component (e.g., 452) on a lower surface of the second conductive layer (e.g., 427); and inserting the mounting posts (e.g., 445) having the sleeve (e.g., 440) into the one or more through-holes (e.g., 430) so that when seated, no part of the mounting posts makes contact with the carbon material layer (e.g., 410).

Consequently, in view of the wide variety of permutations to the embodiments described herein, this detailed description and accompanying material is intended to be illustrative only, and should not be taken as limiting the scope of the invention.

What is claimed is:

1. A noise dampening energy efficient circuit board, comprising:
   a first insulating dielectric layer;
   a carbon material layer disposed on the first dielectric layer, the carbon material layer extending contiguously between the edges of the circuit board;
   a second insulating dielectric layer having a particular thickness, the second insulating dielectric layer disposed on the carbon material layer; and
   a conductive layer formed into a conductive pattern, the conductive layer disposed on the second insulating dielectric layer,
   wherein the carbon material layer includes resin-impregnated carbon fiber fabric;
   the carbon material layer being encapsulated between the insulating dielectric layers so as to float in electrical isolation from the conductive layer, and having resin-impregnated carbon fibers extending contiguously between the edges of the circuit board substantially parallel to the dielectric and conductive layers and being resistively conductive to electromagnetic radiation to dampen electromagnetic noise relative to the conductive layer, wherein, the resin-impregnated carbon fiber fabric has a specific resistance no greater than 100 Ω/cm2.

2. The noise dampening energy efficient circuit board of claim 1, wherein: each insulating dielectric layer includes glass fiber material.

3. The noise dampening energy efficient circuit board of claim 1, further comprising:
   one or more through-holes extending through the conductive layer, the carbon material layer and the insulating dielectric layers including through the conductive pattern formed in the conductive layer;
   a surface mount component disposed on an upper surface of a portion of the pattern, the surface mount component including one or more mounting posts; and
   one or more insulating sleeves disposed around the one or more mounting posts of the surface mount component, wherein:
   the surface mount component having the one or more insulated mounting posts is inserted in the one or more through-holes so that the sleeves selectively insulate the one or more mounting posts from at least one layer of the circuit board; and
   the one or more insulative sleeves are configured to selectively insulate the one or more mounting posts from the carbon material layer.

4. The noise dampening energy efficient circuit board of claim 3, wherein the one or more sleeves are configured to selectively insulate the one or more mounting posts from all of the insulating dielectric layers, and the carbon material layer.

5. The noise dampening circuit energy efficient board of claim 3, wherein the carbon material layer is structured of woven or nonwoven carbon fiber fabric including carbon fiber strands oriented in a direction similar to a trace pattern in the conductive pattern to reduce phase shift and dampen electromagnetic noise transmitted between surface mount components.

6. The noise dampening energy efficient circuit board of claim 1, including a second conductive layer formed on a side of the first dielectric layer opposite the carbon material layer and the carbon material layer is electrically isolated from the second conductive layer.

7. The noise dampening energy efficient circuit board of claim 6, including a mounting post extending through the board to electrically couple the conductive layers, the mounting post insulatively encapsulated within the carbon material layer.

8. A noise dampening energy efficient circuit board having a length and a width defined by edges, comprising:
   a carbon material layer extending contiguously between the edges of the circuit board;
   a glass fiber material layer having a particular thickness, the glass fiber material layer disposed on the carbon material layer; and
   a conductive layer configured into a conductive pattern, the conductive layer disposed on the glass fiber material layer,
   wherein the carbon material layer is comprised of resin-impregnated carbon fiber fabric floating in electrical isolation from the conductive layer, and including carbon fiber strands or threads that are resistively conductive of electromagnetic radiation and extend substantially the length or width of the circuit board to dampen electromagnetic noise relative to the conductive layer, wherein, the resin-impregnated carbon fiber fabric has a specific resistance no greater than 100 Ω/cm2.

9. The noise dampening energy efficient circuit board of claim 8, further comprising an insulating dielectric layer, wherein the carbon material layer is disposed on the dielectric layer so as to be encapsulated between the glass fiber material layer and the insulating dielectric layer.

10. The noise dampening energy efficient circuit board of claim 8, further comprising:
   a surface mount component disposed on an upper surface of the conductive layer, the surface mount component including one or more mounting posts having one or more electrically insulating sleeves,
   wherein the carbon material layer is electrically isolated from the one or more mounting posts, any other electrical circuit, and earth ground.

11. The noise dampening energy efficient circuit board of claim 10, wherein the one or more sleeves are disposed around the one or more mounting posts and extend at least from an upper surface of the glass fiber material layer to a lower surface of the carbon material layer.

12. The noise dampening energy efficient circuit board of claim 10, further comprising an insulating dielectric layer, wherein the one or more sleeves are disposed around the one or more mounting posts and extend at least from an upper surface of the carbon material layer to a lower surface of the insulating dielectric layer, wherein the carbon material layer is disposed on the dielectric layer.

13. The noise dampening energy efficient circuit board of claim 10, wherein the one or more sleeves are disposed around the one or more mounting posts and extend at least from the upper surface of the carbon material layer to a lower surface of the carbon material layer.

\* \* \* \* \*